(12) United States Patent
Ramaraju et al.

(10) Patent No.: US 8,199,547 B2
(45) Date of Patent: Jun. 12, 2012

(54) ERROR DETECTION IN A CONTENT ADDRESSABLE MEMORY (CAM)

(75) Inventors: Ravindraraj Ramaraju, Round Rock, TX (US); Michael D. Snyder, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 264 days.

(21) Appl. No.: 12/703,528

(22) Filed: Feb. 10, 2010

(65) Prior Publication Data
US 2011/0194325 A1 Aug. 11, 2011

(51) Int. Cl.
*G11C 15/00* (2006.01)

(52) U.S. Cl. .................. 365/49.1; 365/49.11; 365/49.15; 365/49.16; 365/49.17; 365/49.18

(58) Field of Classification Search .................. 365/49.1, 365/49.11, 49.15, 49.16, 49.17, 49.18
See application file for complete search history.

(56) References Cited

U.S. PATENT DOCUMENTS

| | | | |
|---|---|---|---|
| 6,430,073 B1 * | 8/2002 | Batson et al. ................. | 365/49.1 |
| 6,597,595 B1 * | 7/2003 | Ichiriu et al. ................ | 365/49.18 |
| 6,690,595 B1 * | 2/2004 | Srinivasan et al. ......... | 365/49.17 |
| 6,700,810 B1 * | 3/2004 | Ichiriu et al. ................ | 365/49.18 |
| 6,707,693 B1 * | 3/2004 | Ichiriu ........................ | 365/49.17 |
| 6,728,124 B1 * | 4/2004 | Ichiriu et al. ................ | 365/49.15 |
| 6,816,396 B2 | 11/2004 | Chai et al. | |
| 6,839,256 B1 * | 1/2005 | Proebsting et al. ......... | 365/49.15 |
| 6,870,749 B1 * | 3/2005 | Park et al. .................... | 365/49.1 |
| 6,879,504 B1 | 4/2005 | Lein et al. | |
| 6,967,856 B1 * | 11/2005 | Park et al. ................... | 365/49.16 |
| 6,978,343 B1 | 12/2005 | Ichiriu | |
| 7,002,823 B1 * | 2/2006 | Ichiriu ........................ | 365/49.17 |
| 7,019,999 B1 * | 3/2006 | Srinivasan et al. ........... | 365/49.1 |
| 7,050,317 B1 * | 5/2006 | Lien et al. .................... | 365/49.1 |
| 7,092,270 B2 | 8/2006 | Lee et al. | |
| 7,100,097 B2 | 8/2006 | Patella et al. | |
| 7,237,172 B2 * | 6/2007 | Regev et al. ................. | 365/49.1 |
| 7,283,380 B1 * | 10/2007 | Srinivasan et al. ......... | 365/49.17 |
| 7,319,602 B1 * | 1/2008 | Srinivasan et al. ........... | 365/49.1 |
| 7,505,295 B1 * | 3/2009 | Nataraj et al. ............... | 365/49.1 |
| 7,539,921 B2 | 5/2009 | Regev et al. | |
| 7,545,661 B2 * | 6/2009 | Srinivasan et al. ........... | 365/49.1 |
| 7,830,691 B2 * | 11/2010 | Srinivasan et al. ........... | 365/49.1 |

* cited by examiner

*Primary Examiner* — Trong Phan (74) *Attorney, Agent, or Firm* — Joanna G. Chiu; Robert L. King (57) ABSTRACT

A content addressable memory and method of operation uses a memory array having a plurality of rows of stored content addressable memory data and compare circuitry for comparing received comparand data with the stored content addressable memory data. A hit signal and one or more parity bits is provided for each row. Erroneous hit detection circuitry coupled to the memory array for each row generates a row error indicator in response to a comparison between parity of the comparand data and parity of a row that is correlated to the hit signal as qualified by assertion of a hit signal of that row. The erroneous hit detection circuitry uses the row error indicator for each row to provide an output which indicates whether at least one asserted hit signal corresponds to an erroneous hit.

20 Claims, 6 Drawing Sheets

ERROR DETECTION IN A CONTENT ADDRESSABLE MEMORY (CAM)

BACKGROUND

1. Field

This disclosure relates generally to a content addressable memory (CAM), and more specifically, to error detection in a CAM.

2. Related Art

Content addressable memories (CAMs) are commonly used in a variety of processor applications. However, as technology continues to progress, the bitcell area continues to shrink which leads to an increase in the soft error rate. Soft errors can occur, for example, when external energy (such as due to alpha particle bombardment) is imparted onto the circuit, causing bit values in the CAM to change. Therefore, as CAM geometries continue to shrink, error detection becomes increasingly important.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a CAM system, erroneous hits (due, for example, to single bit errors or multiple row hits) may be reliably detected by qualifying parity comparisons on a per-row basis. Furthermore, these errors can be reliably detected while using maskable segments with the CAM in which, for example, each row of a CAM may mask different segments.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
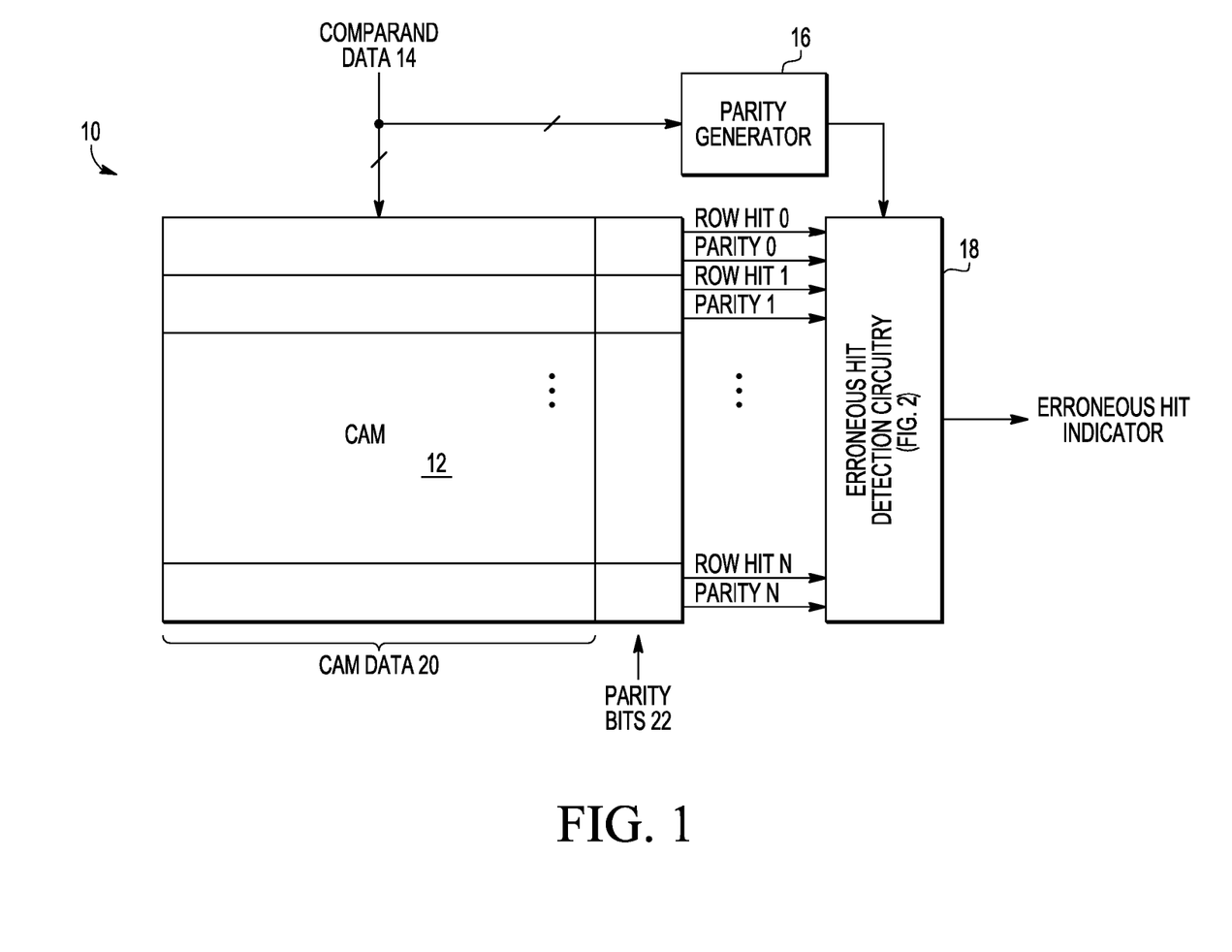
FIG. 1 illustrates, in block diagram form, a CAM system in accordance with one embodiment of the present invention.

FIG. 1 illustrates a CAM system 10 in accordance with one embodiment of the present invention. CAM system 10 includes a CAM 12 (also referred to as a memory array), a parity generator 16, and erroneous hit detection circuitry 18. CAM 12 stores both CAM data 20 and parity bits 22. CAM 12 includes N+1 rows, where each row stores both CAM data and one or more corresponding parity bits. CAM 12 provides a N+1 row hit signals (row hit 0 to row hit N) and N+1 parity signals (parity 0 to parity N) to erroneous hit detection circuitry 18 (one row hit signal and one parity signal from each row). Note that a "row" of CAM 12 can interchangeable be referred to as an "entry" of CAM 12. Comparand data 14 is provided to both CAM 12 and parity generator 16, and parity generator 16 provides one or more generated parity bits to erroneous hit detection circuitry 18, which then outputs an erroneous hit indicator.

In operation, when comparand data 14 is received by CAM system 10, it is provided to both CAM 12 and parity generator 16. CAM system 10 determines if comparand data 14 matches any valid entries of CAM 12. (Note that the compare circuitry for determining if comparand data 14 matches any valid entries of CAM 12 is known in the art and thus will not be described in more detail herein.) If comparand data 14 matches a valid entry, then the corresponding row hit signal is asserted to indicate a hit of that row. Note that, although not illustrated in FIG. 1, each entry of CAM 12 may also include a valid bit, such that a hit of a particular row occurs when the CAM data of that particular row matches the received comparand data and that particular row is marked as valid. For any entry which does not result in a hit, the corresponding row hit signal is negated. These row hit signals and the parity bit of each row (parity 0 to parity N) is used by erroneous hit detection circuitry 18 to determine if an erroneous hit occurred, and provide the erroneous hit indicator accordingly.

Note that, in one embodiment, each valid entry of CAM 12 should have a unique entry such that each received comparand data only results in one hit. However, due to errors (such as soft errors described above) in the entries of CAM 12 (such as, for example, single-bit errors in the entries), it may be possible for more than one entry or row of CAM 12 to result in a row hit within CAM 12. Erroneous hit detection circuitry 18 therefore is able to use the row hit signals and the parity signals from CAM 12 to determine if any of the one or more hits which may have resulted in response to received comparand data is erroneous. Furthermore, by qualifying the parity comparisons on a per-row basis prior to an OR compression/reduction of the results, erroneous hits can be reliably detected. For example, in many current CAM systems, all parity bits in a column output by the CAM are dynamically ORed (and not qualified on a per-row basis). However, in these current CAM systems, multiple hit errors (errors resulting from hitting multiple entries in the CAM) cannot be reliably detected. For example, if the generated parity of input comparand data is a "1," and the input comparand data, due to a single bit error, actually results in two hits, the parity of one of the hit rows will be a "1" and the other a "0" (since it is a single bit error). Therefore, the output parity will also be a "1" since all the parity bits are ORed together (prior to comparison with the generated parity), and so long as one hit row provides a parity of "1", the output parity will be "1". In this case, the output parity of "1" matches the generated parity of "1" and thus a multiple hit error would not be detected, even though one occurred. This is in contrast to CAM system 10 of FIG. 1, in which the multiple hit error, in this example, would be detected since each parity comparison, as will be described in more detail with respect to FIG. 2, is qualified on a per-row basis.

Figure 2:
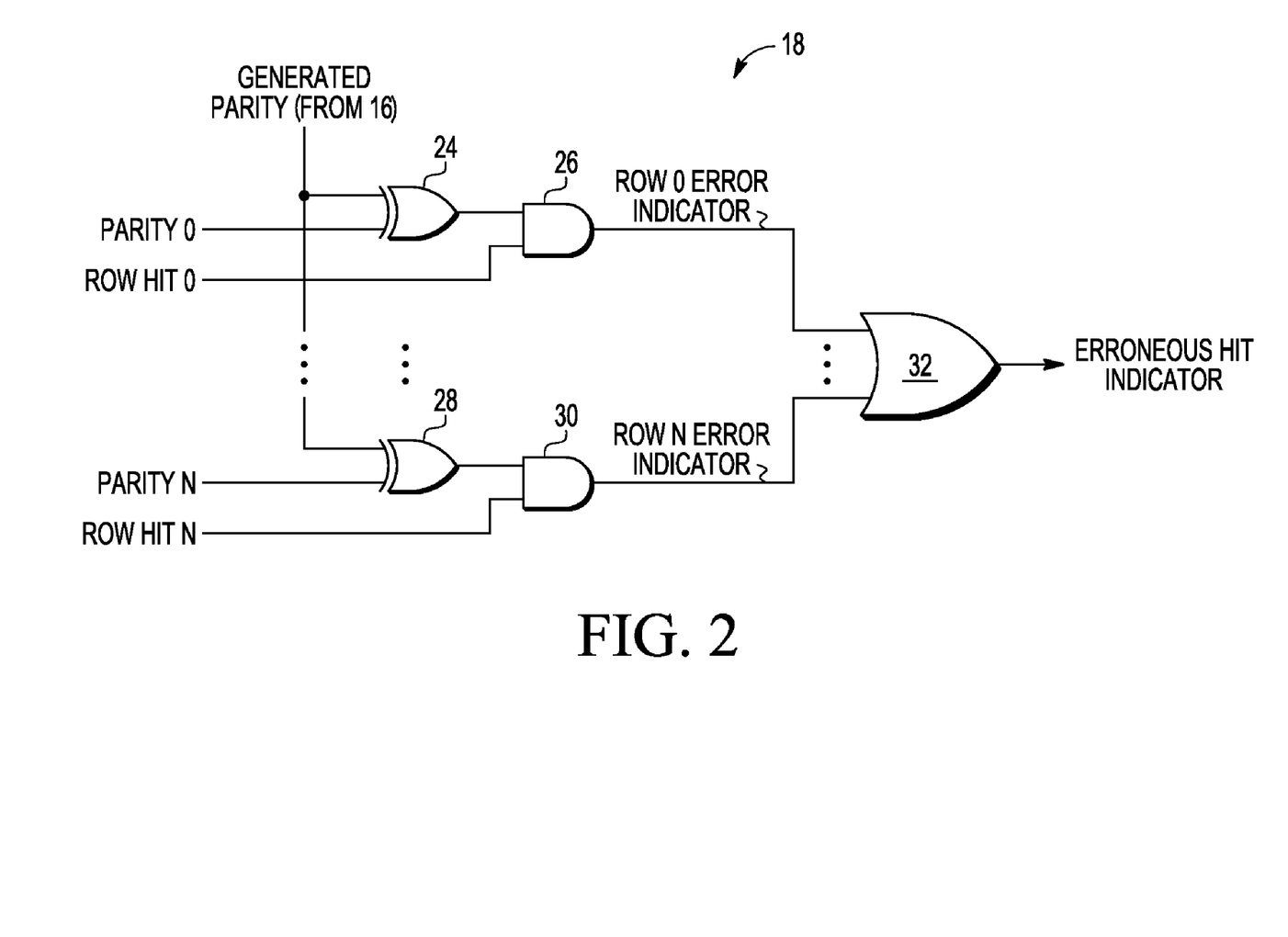
FIG. 2 illustrates, in schematic form, details of the erroneous hit detection circuitry of FIG. 1 in accordance with one embodiment of the present invention.

FIG. 2 illustrates, in schematic form, further details of erroneous hit detection circuitry 18 in accordance with one embodiment of the present invention. Circuitry 18 includes exclusive OR (XOR) gates 24 and 28, AND gates 26 and 30, and OR gate 32 (also referred to as a reducing logic gate). XOR gate 24 receives the generated parity bit from parity generator 16 at a first input and parity 0 at a second input. In one embodiment, it is assumed that parity generator 16 uses comparand data 14 to generate a single parity bit (which indicates whether an odd or even number of "1"s is present in the comparand data). In alternate embodiments, as will be described in reference to FIGS. 3-5 below, multiple parity bits may be generated, or, in yet another alternate embodiment, other types of syndromes may be generated. Parity 0 is the parity bit received from row 0 of CAM 12. The output of XOR gate 24 is provided to a first input of AND gate 26 and row hit 0 (which is the row hit signal received from row 0 of CAM 12) is provided to a second input of AND gate 26. The output of AND gate 26 provides a row 0 error indicator and is provided to a first input of OR gate 32. Similarly, the generated parity bit from parity generator 16 is provided to a first input of XOR gate 28 and parity N (the parity bit received from row N of CAM 12) is provided to a second input of XOR gate 28, and the output of XOR gate 28 is provided to a first input of AND gate 30. Row hit B, which is the row hit signal received from row N of CAM 12, is provided to a second input of AND gate 30, and the output of AND gate 30 provides a row N error indicator and is provided to another input of OR gate 32. Note that only circuitry corresponding to row 0 and row N of CAM 12 is illustrated in FIG. 2; however, note that similar circuitry would be used for each of rows 1 through N−1 as well. That is, for each row, an XOR gate would receive the generated parity and a parity bit from a corresponding row of CAM 12, where the output of the XOR gate would go to an AND gate. That AND gate would also receive a row hit signal from the corresponding row of CAM 12, and the output of the AND gate would provide an error indicator for the corresponding row of CAM 12 to one of the inputs of OR gate 32.

In operation, an error indicator (row 0 error indicator through row N error indicator) is provided corresponding to each row of CAM 12 in response to a comparison of received comparand data 14. If any one or more of the error indicators is asserted, then the output of OR gate 32 will be asserted, thus asserting the erroneous hit indicator. For example, for each row, such as row 0, the generated parity bit is compared with the parity bit received from CAM 12, such as parity 0. For an error to not be detected, these two bits should have the same value. Therefore, if they are the same, the output of XOR 24 will be a logic level zero, meaning that row 0 error indicator cannot be asserted, regardless of the value of row hit 0. However, if they are not the same, the output of XOR 24 will be a logic level one, meaning that row 0 error indicator will be asserted only if the second input to AND gate 26 is also a logic level one. Therefore, if row hit 0 as asserted, indicating that row 0 is a valid entry which matches comparand data 14, row 0 error indicator is asserted. Therefore, note that a row 0 error will only be indicated if the parities do not match and a hit has occurred for row 0. That is, if the parity mis-match is not qualified with a corresponding row hit, the corresponding row error indicator will not be asserted. This description also applies to each of parities 1 to N and row hit signals 1 to N. That is, a parity mis-match of any of parity 0 through N with the generated parity will only result in assertion of the corresponding row error indicator if the mis-match is also qualified by a hit of comparand data 14 in the corresponding row. In this manner, note that, unlike the current CAM systems described above, a row hit which includes an error, or any comparison which results in multiple rows hitting due, for example, to a single bit error, can be reliably detected.

Figure 3:
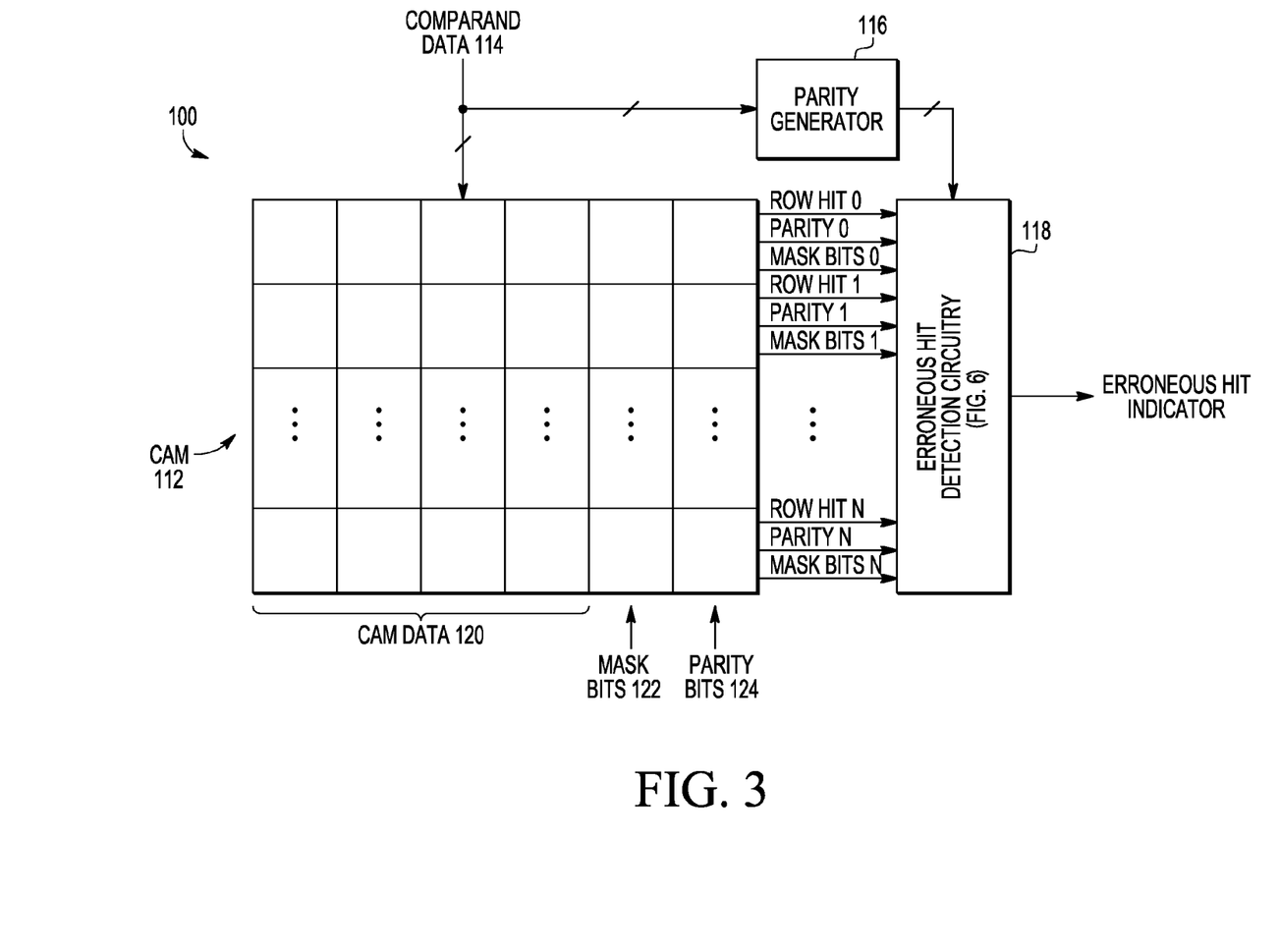
FIG. 3 illustrates, in block diagram form, a CAM system with masking bits in accordance with one embodiment of the present invention.

FIG. 3 illustrates a CAM system 100 in accordance with one embodiment of the present invention. CAM system 100 is similar to CAM system 10 in many ways; however, CAM system 100 also utilizes mask bits. CAM system 100 includes a CAM 112 (also referred to as a memory array), a parity generator 116, and erroneous hit detection circuitry 118. CAM 112 stores CAM data 120, mask bits 122, and parity bits 124. CAM 112 includes N+1 rows, where each row stores CAM data, one or more corresponding mask bits, and one or more corresponding parity bits. Further details of an entry of CAM 112 will be described in reference to FIG. 4 below. CAM 112 provides N+1 row hit signals (row hit 0 to row hit N), N+1 parity signals (parity 0 to parity N), and N+1 mask signals (mask bits 0 to mask bits N) to erroneous hit detection circuitry 118 (one row hit signal, one parity signal, and one mask signal from each row). Note that a "row" of CAM 112 can interchangeable be referred to as an "entry" of CAM 112. In one embodiment, each parity signal includes multiple parity bits and each mask signal includes multiple mask bits, as will be described in more detail below. Comparand data 114 is provided to both CAM 112 and parity generator 116, and parity generator 116 provides generated parity bits (GP0 to GP3) to erroneous hit detection circuitry 118, which then outputs an erroneous hit indicator.

Figure 4:
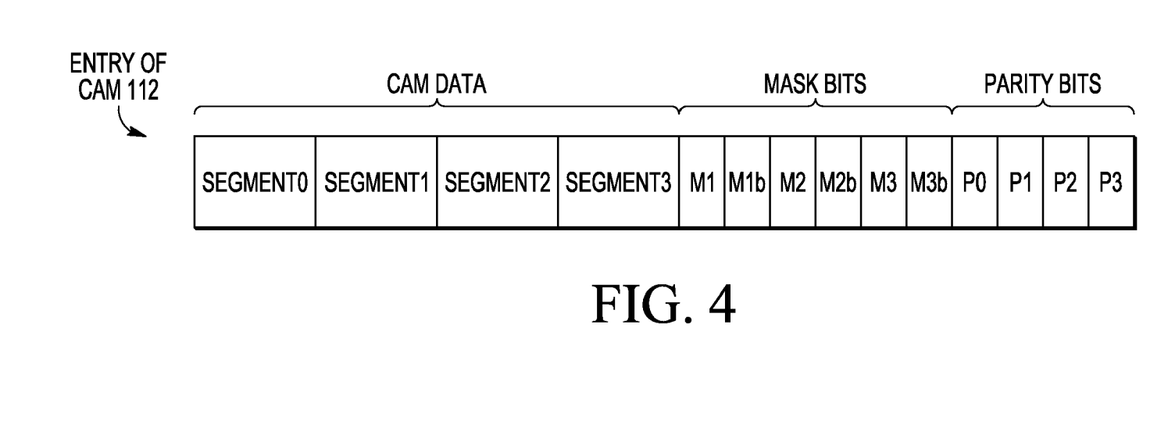
FIG. 4 illustrates, in block diagram form, an example entry of the CAM system of FIG. 3.
Figure 5:
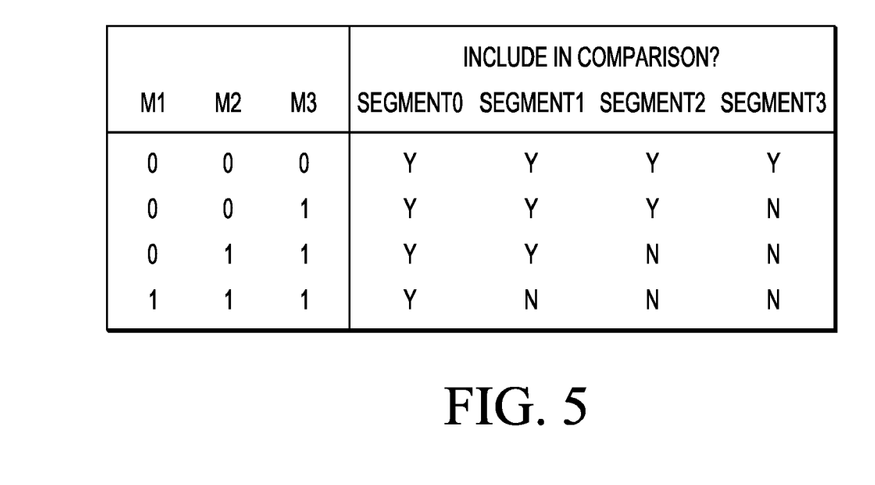
FIG. 5 illustrates, in table form, an example of the masking bit values.

FIG. 4 illustrates further details of an exemplary entry of CAM 112. The entry of FIG. 4 includes 4 segments of CAM data (segments 0 through 3), 3 mask bits (M1, M2, and M3), 3 complementary mask bits (M1b which is the complement of M1, M2b which is the complement of M2, and M3b which is the complement of M3), and 4 parity bits (P0 through P3). In one embodiment, segment 0 is a non-maskable segment of CAM data (meaning that it is always used in a comparison with comparand data 114), and segments 1 through 3 are maskable segments (meaning that they may or may not be used in a comparison with comparand data 114, as indicated by the mask bits M1, M2, and M3). For example, FIG. 5 illustrates one example of how the mask bits may be used to mask segments 1 to 3. The right portion of FIG. 5 indicates, for particular values of M1, M2 and M3, which segments of the CAM data are used for comparing with corresponding segments of comparison data 114. For example, note that when M1, M2, and M3 are all logic level zeros, all segments (i.e. the full value of the CAM data) is used for comparison with all segments of comparand data 114. When M1 and M2 are logic level zeros but M3 is a logic level 1, then segment 3

(which corresponds to mask bit M3) is masked out and not used in the comparison. That is, segments 0 to 2 of the CAM data is compared to segments 0 to 2 of comparand data 114 to determine if a hit occurs. When M1 is a logic level zero and M2 and M3 are logic levels 1, then segments 2 and 3 (which correspond to mask bits M2 and M3) are masked out and not used in the comparison. That is, segments 0 and 1 of the CAM data are compared to segments 0 and 1 of comparand data 114 to determine if a hit occurs. When each of M1, M2, and M3 are logic level ones, then segments 1 to 3 are all masked out, and only the non-maskable segment 0 of CAM data is compared to segment 0 of comparand data 114 to determine whether a hit occurs.

In the illustrated embodiment, segment 0 is non-maskable. However, in alternate embodiments, another mask bit may be used to mask out segment 0 as well. Also, note that each segment of CAM data may correspond to any number of bits. In one embodiment, the CAM data portion of each entry includes 32 bits, where each segment corresponds to a 8 bits. Also, in the illustrated embodiment, M1, M2, and M3 directly indicate whether the corresponding segment is masked or not. Alternatively, a fewer or greater number of bits with different encodings can be used to indicate the masked portions. Also, in the illustrated embodiment, along with storing each mask bit, each entry also stores the complement of the mask bit, such as M1$b$, M2$b$, and M3$b$. These complement bits may be used to detect errors which occur in the mask bits, an example of which will be described below in reference to FIG. 6. Alternatively, each mask bit can be duplicated (such that M1 is stored twice, M2 twice, etc., rather than storing the complement of each mask bit). The duplicated bits can also be used for error detection of the mask bits. The complement of the mask bit may be stored in a separate bit along with the mask bit or can be the complement value provided by the mask bit storage bit. In one embodiment, the mask bit is a separate bit to facilitate error detection in the mask bit.

Still referring to the exemplary entry of FIG. 4, each segment of the CAM data has a corresponding parity bit, P0 to P3, respectively. That is, each segment has its own parity bit. Therefore, note that each entry of CAM 112 in FIG. 3 includes an entry in the format shown in FIG. 4, in which each entry can be masked differently by using the corresponding mask bits of the entry.

In operation, when comparand data 114 is received by CAM system 100, it is provided to both CAM 112 and parity generator 116. CAM system 100 determines if comparand data 114 matches any valid entries of CAM 112, where the comparison to the valid entries includes comparing only those segments of the entry which are not masked to the corresponding segments of comparand data 114 to determine a hit. (Note that the compare circuitry for determining if comparand data 114 matches any valid entries of CAM 112 is known in the art and thus will not be described in more detail herein.) If comparand data 114 matches a valid entry, then the corresponding row hit signal is asserted to indicate a hit of that row. (Note that, although not illustrated in FIG. 3, each entry of CAM 112 may also include a valid bit, such that a hit of a particular row occurs when the non-masked CAM data of that particular row matches the corresponding segments of the received comparand data and that particular row is marked as valid.) For any entry which does not result in a hit, the corresponding row hit signal is negated. These row hit signals, along with the parity bits of each row (parity 0 to parity N) and the mask bits of each row (mask bits 0 to N) is used by erroneous hit detection circuitry 118 to determine if an erroneous hit occurred, and provide the erroneous hit indicator accordingly.

Note that, in the illustrated embodiment, each of parity 0 to parity N includes 4 parity bits from the corresponding row, P0 to P3. Therefore, for the case of row 0, parity 0 includes P0-P3 of row 0. Each of the parity bits for row 0 can be denoted as P0,0, P1,0, P2,0, and P3,0 in which the first number indicates the particular parity bit and the second number following the comma can indicate the row to which it corresponds. Therefore, for row N, the bits of parity N can be denoted as P0,N, P1,N, P2,N, and P3,N. Also, in the illustrated embodiment, each of mask bits 0 to mask bits N includes 6 mask bits from the corresponding row, M1, M1$b$, M2, M2$b$, M3, and M3$b$. Therefore, for the case of row 0, mask bits 0 includes M1, M1$b$, M2, M2$b$, M3, and M3$b$ of row 0. Each of the mask bits for row 0 can be denoted as M1,0, M1$b$,0, M2,0, M2$b$,0, M3,0, and M3$b$,0. Therefore, for row N, the bits of mask bits N can be denoted as M1, N, M1$b$, N, M2, N, M2$b$, N, M3, N, and M3$b$,N.

Parity generator 116 uses comparand data 114 to generate or compute generated parity bits. In one embodiment, parity generator 116 generates a parity bit corresponding to each segment of comparand data 114. Therefore, in the current example in which 4 segments of CAM data are defined (as was described in reference to FIG. 4), parity generator 116 generates 4 parity bits, GP0 to GP3, from comparand data 114, where each segment of comparand data 114 includes the same number of bits as the segments of the CAM data. These parity bits are used by erroneous hit detection circuitry 118, in addition to the row hit signals, parity signals, and mask bit signals from CAM 112, to generate the erroneous hit indicator.

Figure 6:
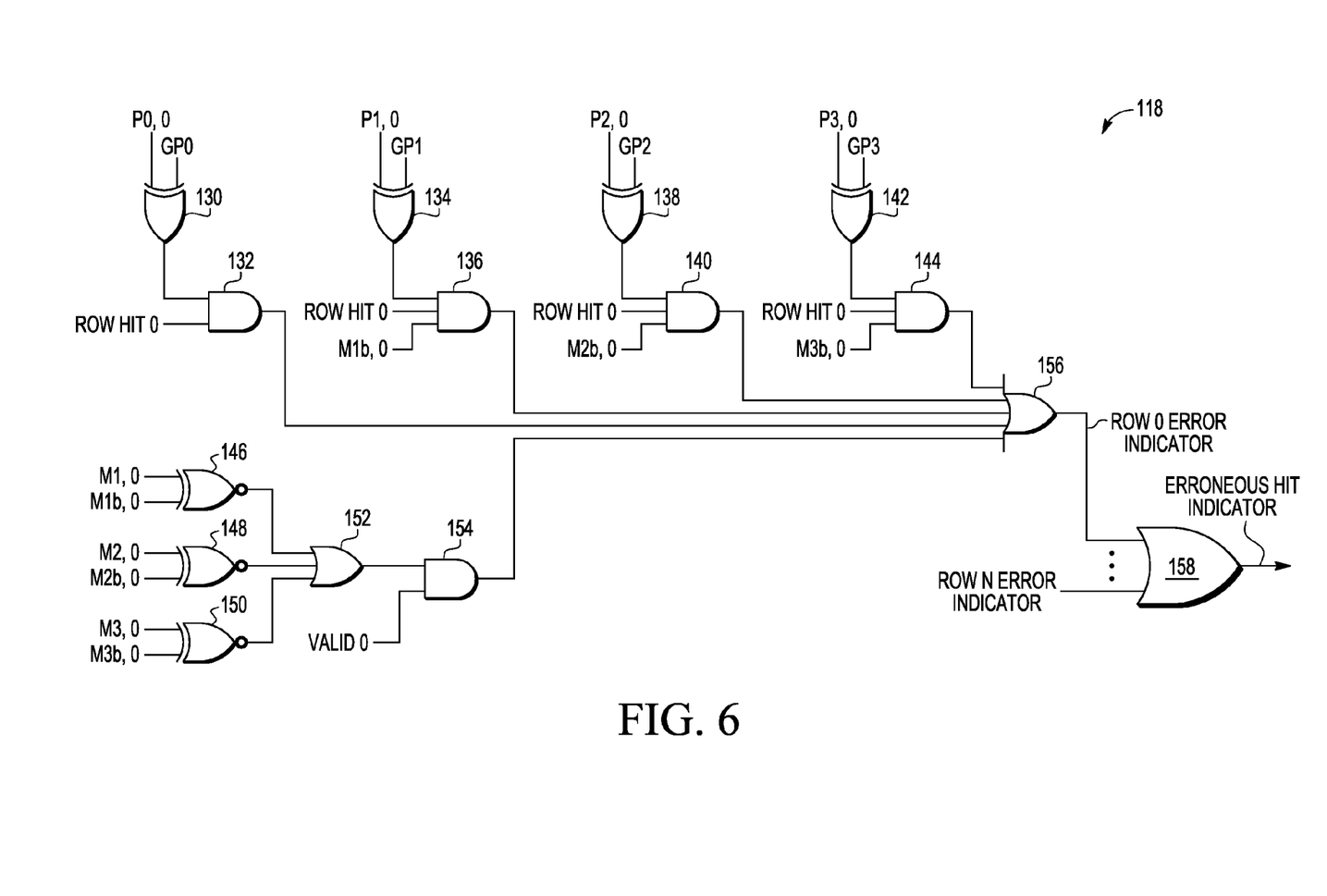
FIG. 6 illustrates, in schematic form, details of the erroneous hit detection circuitry of FIG. 3 in accordance with one embodiment of the present invention.

FIG. 6 illustrates, in schematic form, further details of erroneous hit detection circuitry 118 in accordance with one embodiment of the present invention. Circuitry 118 includes exclusive OR (XOR) gates 130, 134, 138, and 142, AND gates 132, 136, 140, 144, and 154, XNOR gates 146, 148, and 150, and OR gates 152, 156, and 158 (also referred to as reducing logic gates). XOR gate 130 receives P0,0 at a first input and GP0 at a second input and provides an output to a first input of AND gate 132. Row hit 0 is provided to a second input of AND gate 132, and an output of AND gate 132 is provided to an input of OR gate 156. XOR gate 134 receives P1,0 at a first input and GP1 at a second input and provides an output to a first input of AND gate 136. Row hit 0 is provided to a second input of AND gate 136, M1$b$,0 is provided to a third input of AND gate 136, and an output of AND gate 136 is provided to another input of OR gate 156. XOR gate 138 receives P2,0 at a first input and GP2 at a second input and provides an output to a first input of AND gate 140. Row hit 0 is provided to a second input of AND gate 140, M2$b$,0 is provided to a third input of AND gate 140, and an output of AND gate 140 is provided to another input of OR gate 156. XOR gate 142 receives P3,0 at a first input and GP3 at a second input and provides an output to a first input of AND gate 144. Row hit 0 is provided to a second input of AND gate 144, M3$b$,0 is provided to a third input of AND gate 144, and an output of AND gate 144 is provided to another input of OR gate 156. XNOR gate 146 receives M1,0 at a first input and M1$b$,0 at a second input and provides an output to a first input of OR gate 152. XNOR gate 148 receives M2,0 at a first input and M2$b$,0 at a second input and provides an output to a second input of OR gate 152. XNOR gate 150 receives M3,0 at a first input and M3$b$,0 at a second input and provides an output to a third input of OR gate 152. An output of OR gate 152 is provided to a first input of AND gate 154 and a valid bit for row 0 (valid 0) is provided to a second input of AND gate 154. An output of AND gate 154 is provided to another input of OR gate 156. OR gate 156 outputs an error indicator for row 0 (row 0 error indicator) to a first input of OR gate 158 which provides the erroneous bit indicator at its output.

Note that only the circuitry provided to generate row 0 error indicator is illustrated in FIG. 6. However, each input of OR gate 158 would receive an error indicator corresponding to each of rows 1 to N. The circuitry to generate each of these error indicators (row 1 error indicator to row N error indicator) is analogous to the circuitry used to generate read 0 error indicator. Note also that AND gate 132 does not receive a mask bit at its input because, in the illustrated embodiment, it is assumed that segment 0 is a non-maskable segment. In an alternate embodiment, in which segment 0 is maskable, AND gate 132 may include another input to receive the corresponding mask bit.

In operation, an error indicator (row 0 error indicator through row N error indicator) is provided corresponding to each row of CAM 112 in response to a comparison of received comparand data 114. If any one or more of the error indicators is asserted, then the output of OR gate 158 will be asserted, thus asserting the erroneous hit indicator. For example, for each row, such as row 0, the generated parity bit for each segment is compared with the corresponding parity bit for the segment received from CAM 112. That is, P0,0 is compared with GP0, P1,0 is compared with GP1, etc. These parity bits (the one from CAM 112 and the generated one from parity generator 116) are expected to have the same value if no error is present. Therefore, if they are the same, the output of the corresponding XOR gate will be a logic level zero, meaning that row 0 error indicator cannot be asserted, regardless of the value of row hit 0, or any of the mask bits. However, if they are not the same, the output of the corresponding XOR gate will be a logic level one, meaning that row 0 error indicator will be asserted only if the corresponding segment is not masked (the corresponding complement mask bit is asserted), and row hit 0 is also asserted. Therefore, note that a row 0 error can only be indicated if the parities of non-masked segments (i.e. enabled segments) do not match and a hit has occurred for row 0. That is, if the parity mis-match for enabled segments is not qualified with a corresponding row hit, the corresponding row error indicator will not be asserted.

In the embodiment of FIG. 6, note that the row error indicator is further qualified by the mask bits and valid bit. That is, an error for a row can only be indicated if the mask bits are correct and correspond to a valid entry. For example, for each entry of CAM 112, both the mask bits and complement mask bits are stored. Therefore, each mask bit and its complement are compared using an XNOR gate to determine if they are different, as they should be. Only if each of mask bit pair M1 and M1b, mask bit pair M2 and M2b, and mask bit pair M3 and M3b are different in value, can the mask bits not include an error themselves. If any of these pairs of bits match, then an error exists in the mask bits. For example, referring to FIG. 6, if any of the pairs match, the output of the corresponding XNOR gate will cause the output of OR gate 152 to be a logic level 1. Then, assuming that the entry is a valid entry, the output of AND gate 154 is also a logic level 1, thus causing the output of OR gate 156 to be a logic level one, thus asserted row 0 error indicator. If the mask bits are correct and each mask bit pair has different values, then row 0 error indicator will only be asserted if the parity of any of the non-masked segments (i.e. enabled segments) does not match the generated parity of the corresponding segment and a hit has occurred for row 0.

Note that the same description provided for row 0 error indicator also applies to row 1 error indicator to row N error indicator. That is, assuming the mask bits are correct, a parity mis-match between the parity of any of the enabled segments and the generated parity of the corresponding segment will only result in assertion of the corresponding row error indicator if the mis-match is also qualified by a hit in the corresponding row (resulting from enabled segments of CAM data in the corresponding row matching corresponding segments of comparand data 114) and if the mask bits do not include an error. In this manner, note that, as with CAM system 10 described above, a row hit which includes an error, or any comparison which results in multiple rows hitting due, for example, to a single bit error, can be reliably detected. These can be reliably detected even when maskable segments are used in which, for example, each entry of CAM 112 can be masked differently.

Figure 7:
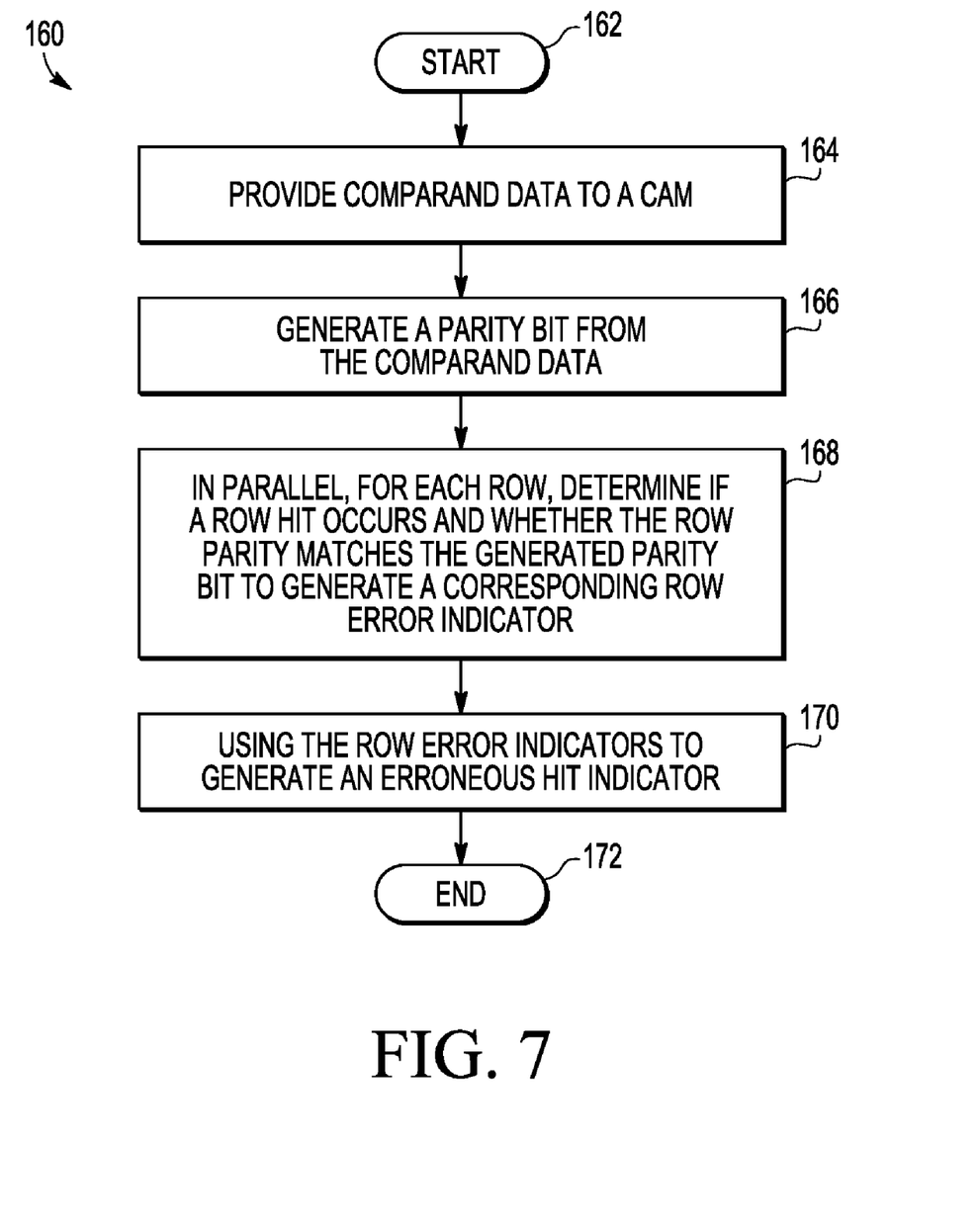
FIG. 7 illustrates, in flow diagram form, a method of operating a CAM system in accordance with one embodiment of the present invention.

FIG. 7 illustrates a flow 160 of an example method of operating a CAM. Flow 160 begins with start 162 and proceeds to block 164 in which comparand data is provided to a CAM. Flow then proceeds to block 166 in which a parity bit is generated from the comparand data. For example, the comparand data may correspond to comparand data 14 and the generated parity may correspond to the output of parity generator 16. (Note that in the case of maskable segments, more than one parity bit may be generated from the comparand data.) Flow then proceeds to block 168 in which, in parallel, for each row of the CAM, it is determined if a row hit occurs and whether the row parity matches the generated parity bit in order to generate a corresponding row error indicator. For example, as described above, row hits 0 to N may be used to qualify the parity comparisons (both in the embodiments of FIG. 1 and FIG. 3) in generating the corresponding row error indicators, row 0 error indicator to row N error indicator. Also, depending on whether maskable segments are used, the row parity may include multiple parity bits. Flow then proceeds from block 168 to 170 in which the row error indicators are used to generate an erroneous hit indicator. As described above, the erroneous hit indicator is able to reliably detect multiple row hits due, for example, to a single bit error whereas, in current CAM systems available today, multiple row hits cannot be reliably detected. Flow then proceeds to end 172.

By now it should be appreciated that there has been provided a CAM system in which erroneous hits are detected. Furthermore, multiple row hits can be reliably detected by qualifying parity comparisons on a per-row basis. Also, these errors can be reliably detected while using maskable segments in which, for example, each row of a CAM may mask different segments. In alternate embodiments, other error detection schemes, other than parity, may be used to generate syndrome bits, where the systems described above would still reliably detect erroneous hits and erroneous multiple row hits. Also, in one embodiment, note no reading of information stored in the CAM memory array is required in order to perform the multiple hit error detection.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different CAM system architectures. For example, although FIG. 1 and the discussion thereof describe an exemplary CAM system, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Also, different circuitry may be used to perform the logic functions described, for example, in reference to the erroneous hit detection circuitries 18 and 118. Thus, it is to be understood that the architectures and circuitry depicted herein are merely exemplary, and that in fact many other architectures or circuitry can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Also, some operations may occur concurrently or serially.

Although the invention is described herein with reference to specific embodiments, various modifications and changes can be made without departing from the scope of the present invention as set forth in the claims below. For example, masking may or may not be used within the CAM system, or other types of error detection other than parity may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a content address memory (CAM) including a memory array having a plurality of rows of stored content addressable memory data and compare circuitry for comparing received comparand data with the stored content addressable memory data, the memory array providing a hit signal and one or more parity bits for each row, and erroneous hit detection circuitry coupled to the memory array. The erroneous hit detection circuitry for each row generates a row error indicator in response to a comparison between parity of the comparand data and parity of a row that is correlated to the hit signal as qualified by assertion of a hit signal of that row, and the erroneous hit detection circuitry uses the row error indicator for each row to provide an output which indicates whether at least one asserted hit signal corresponds to an erroneous hit. Item 2 includes the CAM of item 1, wherein the erroneous hit detection circuitry further includes a first plurality of logic gates for receiving one or more generated parity bits of the comparand data and parity bits stored in the content addressable memory, and a second plurality of logic gates coupled to the first plurality of logic gates. The first plurality of logic gates indicate whether correlated one or more generated parity bits of the comparand data and one or more parity bits stored in the content addressable memory match. The second plurality of logic gates further qualify results of the first plurality of logic gates by limiting error indication to one or more rows of the content addressable memory having a hit. Item 3 includes the CAM of item 2 and further includes a reducing logic gate coupled to the second plurality of logic gates for receiving a plurality of row error indicators, each being correlated to a predetermined row of the content addressable memory, and providing a single error signal in response to any row of the content addressable memory having a hit and containing an error. Item 4 includes the CAM of item 1, wherein the memory array further provides one or more mask bits for each row of the memory array to the erroneous hit detection circuitry. The one or more mask bits respectively is correlated to one or more predetermined segments of data within a correlated row to selectively prevent the output from the erroneous hit detection circuitry from being asserted even if an error is detected within the one or more predetermined segments of data. Item 5 includes the CAM of item 4 wherein the erroneous hit detection circuitry further includes, for each row of the memory array, a first plurality of logic gates for indicating if one or more parity bits for each row differ in value from correlated one or more generated parity bits of the comparand data, and a second plurality of logic gates coupled to the first plurality of logic gates for indicating whether a parity bit error is indicated and whether a row hit occurred. Item 6 includes the CAM of item 5, wherein the erroneous hit detection circuitry further includes an error indicating logic gate coupled to an output of the second plurality of logic gates for each row of the memory array, the error indicating logic gate providing a single erroneous hit indicator if any error is indicated for any single and multiple row hits in the memory array. Item 7 includes the CAM of item 5, wherein at least a portion of the second plurality of logic gates are further qualified by receiving at least one mask bit having a value which prevents a segment of a predetermined row of the memory array from having any error indicated regardless of whether an error exists or not. Item 8 includes the CAM of item 7, wherein the erroneous hit detection circuitry further includes, for each row of the memory array, a third plurality of logic gates having an output coupled to the second plurality of logic gates for determining validity of the at least one mask bit, wherein a detected error of the at least one mask bit causes the erroneous hit detection circuitry to indicate an error. Item 9 includes the CAM of item 1, wherein multiple hits occur in the array and the output indicates that at least one generated hit contained error without reading any of the stored content addressable memory data to determine that one of the multiple hits contained error.

Item 10 includes a method including providing a comparand value to a memory array to determine if the memory array contains one or multiple rows having a matching value; generating parity bits associated with the comparand value to form generated parity bits; asserting one or multiple row hit signals; on a row by row basis, determining if the generated parity bits match stored parity information, wherein a row error indicator is asserted for each row in which there is no match of the generated parity bits and stored parity information and there is a hit, and wherein a row error indicator is not asserted for each row in which there is no match of the generated parity bits and stored parity information and there is no hit; and providing a single erroneous hit indicator in response to assertion of any row error indicator for a row having a hit, wherein no reading of information stored in the memory array is required to perform multiple hit error detection in the memory array. Item 11 includes the method of item 10 and further includes storing one or more mask bits in each of one or more rows of the memory array, the one or more mask bits being correlated to a predetermined segment of the one or more rows; and when a row hit is indicated for a row containing the one or more mask bits, using a value of the one or more mask bits to determine whether to prevent the segment of the one or more rows of the memory array from having any error indicated regardless of whether an error exists or not. Item 12 includes the method of item 10, wherein the step of determining if the generated parity bits match stored parity information in each row and asserting a row error indicator for that row when there is no match of the generated parity bits and stored parity information occurs in parallel for each of a plurality of rows and one or more row error indicators are provided concurrently.

Item 13 includes a CAM including a memory array having a plurality of rows of stored content addressable memory data and compare circuitry for comparing received comparand data with the stored content addressable memory data, the memory array providing a hit signal and one or more parity bits for each row; a parity generator having an input for receiving the comparand data and having an output for providing one or more generated parity bits; and erroneous hit detection circuitry coupled to the memory array and the parity generator. The erroneous hit detection circuitry asserts a row error indicator for each row in which parity of the comparand data does not match parity of a row and there is an assertion of a hit signal for that row. The erroneous hit detection circuitry does not assert the row error indicator for each row in which parity of the comparand data matches parity of a row and there is no assertion of the hit signal for that row. The erroneous hit detection circuitry uses the row error indicator for each row to provide an output which indicates whether at least one asserted hit signal corresponds to an erroneous hit. Item 14 includes the CAM of item 13, wherein the erroneous hit detection circuitry further includes a first plurality of logic gates for receiving the one or more generated parity bits and parity bits stored in the content addressable memory, and a second plurality of logic gates coupled to the first plurality of logic gates. The first plurality of logic gates indicate whether correlated one or more generated parity bits and parity bits stored in the content addressable memory do not match. The second plurality of logic gates further qualify results of the first plurality of logic gates by limiting error indication to one or more rows of the content addressable memory having a hit. Item 15 includes the CAM of item 14 and further includes a reducing logic gate coupled to the second plurality of logic gates for receiving a plurality of row error indicators, each being correlated to a predetermined row of the content addressable memory, and providing a single error signal in response to any row of the content addressable memory having a hit and containing an error. Item 16 includes the CAM of item 1, wherein the memory array further provides one or more mask bits for each row of the memory array to the erroneous hit detection circuitry. The one or more mask bits respectively is correlated to one or more predetermined segments of data within a correlated row to selectively prevent the output from the erroneous hit detection circuitry from being asserted even if an error is detected within the one or more predetermined segments of data. Item 17 includes the CAM of item 16, wherein the erroneous hit detection circuitry further includes, for each row of the memory array, a first plurality of logic gates for indicating if one or more parity bits for each row differ in value from correlated one or more generated parity bits of the comparand data, and a second plurality of logic gates coupled to the first plurality of logic gates for indicating whether a parity bit error is indicated and whether a row hit occurred. Item 18 includes the CAM of item 17, wherein the erroneous hit detection circuitry further includes an error indicating logic gate coupled to an output of the second plurality of logic gates for each row of the memory array. The error indicating logic gate provides a single erroneous hit indicator if any error is indicated for any single and multiple row hits in the memory array. Item 19 includes the CAM of item 17 wherein at least a portion of the second plurality of logic gates are further qualified by receiving at least one mask bit having a value which prevents a segment of a predetermined row of the memory array from having any error indicated regardless of whether an error exists or not. Item 20 includes the CAM of item 19, wherein the erroneous hit detection circuitry further includes, for each row of the memory array, a third plurality of logic gates having an output coupled to the second plurality of logic gates for determining validity of the at least one mask bit, wherein a detected error of the at least one mask bit causes the erroneous hit detection circuitry to indicate an error.

What is claimed is:

1. A content addressable memory comprising:
a memory array having a plurality of rows of stored content addressable memory data and compare circuitry for comparing received comparand data with the stored content addressable memory data, the memory array providing a hit signal and one or more parity bits for each row; and
erroneous hit detection circuitry coupled to the memory array, the erroneous hit detection circuitry for each row generating a row error indicator in response to a comparison between parity of the comparand data and parity of a row that is correlated to the hit signal as qualified by assertion of a hit signal of that row, the erroneous hit detection circuitry using the row error indicator for each row to provide an output which indicates whether at least one asserted hit signal corresponds to an erroneous hit.

2. The content addressable memory of claim 1 wherein the erroneous hit detection circuitry further comprises:
a first plurality of logic gates for receiving one or more generated parity bits of the comparand data and parity bits stored in the content addressable memory, the first plurality of logic gates indicating whether correlated one or more generated parity bits of the comparand data and one or more parity bits stored in the content addressable memory match; and a second plurality of logic gates coupled to the first plurality of logic gates, the second plurality of logic gates further qualifying results of the first plurality of logic gates by limiting error indication to one or more rows of the content addressable memory having a hit.

3. The content addressable memory of claim 2 further comprising:

a reducing logic gate coupled to the second plurality of logic gates for receiving a plurality of row error indicators, each being correlated to a predetermined row of the content addressable memory, and providing a single error signal in response to any row of the content addressable memory having a hit and containing an error.

4. The content addressable memory of claim 1 wherein the memory array further provides one or more mask bits for each row of the memory array to the erroneous hit detection circuitry, the one or more mask bits respectively being correlated to one or more predetermined segments of data within a correlated row to selectively prevent the output from the erroneous hit detection circuitry from being asserted even if an error is detected within the one or more predetermined segments of data.

5. The content addressable memory of claim 4 wherein the erroneous hit detection circuitry further comprises for each row of the memory array:

a first plurality of logic gates for indicating if one or more parity bits for each row differ in value from correlated one or more generated parity bits of the comparand data; and a second plurality of logic gates coupled to the first plurality of logic gates for indicating whether a parity bit error is indicated and whether a row hit occurred.

6. The content addressable memory of claim 5 wherein the erroneous hit detection circuitry further comprises:

an error indicating logic gate coupled to an output of the second plurality of logic gates for each row of the memory array, the error indicating logic gate providing a single erroneous hit indicator if any error is indicated for any single and multiple row hits in the memory array.

7. The content addressable memory of claim 5 wherein at least a portion of the second plurality of logic gates are further qualified by receiving at least one mask bit having a value which prevents a segment of a predetermined row of the memory array from having any error indicated regardless of whether an error exists or not.

8. The content addressable memory of claim 7 wherein the erroneous hit detection circuitry further comprises for each row of the memory array:

a third plurality of logic gates having an output coupled to the second plurality of logic gates for determining validity of the at least one mask bit, wherein a detected error of the at least one mask bit causes the erroneous hit detection circuitry to indicate an error.

9. The content addressable memory of claim 1 wherein multiple hits occur in the array and the output indicates that at least one generated hit contained error without reading any of the stored content addressable memory data to determine that one of the multiple hits contained error.

10. The content addressable memory of claim 1 wherein the memory array further provides one or more mask bits for each row of the memory array to the erroneous hit detection circuitry, the one or more mask bits respectively being correlated to one or more predetermined segments of data within a correlated row to selectively prevent the output from the erroneous hit detection circuitry from being asserted even if an error is detected within the one or more predetermined segments of data.

11. The content addressable memory of claim 10 wherein the erroneous hit detection circuitry further comprises for each row of the memory array:

a first plurality of logic gates for indicating if one or more parity bits for each row differ in value from correlated one or more generated parity bits of the comparand data; and a second plurality of logic gates coupled to the first plurality of logic gates for indicating whether a parity bit error is indicated and whether a row hit occurred.

12. The content addressable memory of claim 11 wherein the erroneous hit detection circuitry further comprises:

an error indicating logic gate coupled to an output of the second plurality of logic gates for each row of the memory array, the error indicating logic gate providing a single erroneous hit indicator if any error is indicated for any single and multiple row hits in the memory array.

13. The content addressable memory of claim 11 wherein at least a portion of the second plurality of logic gates are further qualified by receiving at least one mask bit having a value which prevents a segment of a predetermined row of the memory array from having any error indicated regardless of whether an error exists or not.

14. The content addressable memory of claim 13 wherein the erroneous hit detection circuitry further comprises for each row of the memory array:

a third plurality of logic gates having an output coupled to the second plurality of logic gates for determining validity of the at least one mask bit, wherein a detected error of the at least one mask bit causes the erroneous hit detection circuitry to indicate an error.

15. A method comprising:

providing a comparand value to a memory array to determine if the memory array contains one or multiple rows having a matching value;

generating parity bits associated with the comparand value to form generated parity bits;

asserting one or multiple row hit signals;

on a row by row basis, determining if the generated parity bits match stored parity information, wherein a row error indicator is asserted for each row in which there is no match of the generated parity bits and stored parity information and there is a hit, and wherein a row error indicator is not asserted for each row in which there is no match of the generated parity bits and stored parity information and there is no hit; and providing a single erroneous hit indicator in response to assertion of any row error indicator for a row having a hit, wherein no reading of information stored in the memory array is required to perform multiple hit error detection in the memory array.

16. The method of claim 15 further comprising:

storing one or more mask bits in each of one or more rows of the memory array, the one or more mask bits being correlated to a predetermined segment of the one or more rows; and when a row hit is indicated for a row containing the one or more mask bits, using a value of the one or more mask bits to determine whether to prevent the segment of the one or more rows of the memory array from having any error indicated regardless of whether an error exists or not.

17. The method of claim 15 wherein the step of determining if the generated parity bits match stored parity information in each row and asserting a row error indicator for that row when there is no match of the generated parity bits and stored parity information occurs in parallel for each of a plurality of rows and one or more row error indicators are provided concurrently.

18. A content addressable memory comprising:
a memory array having a plurality of rows of stored content addressable memory data and compare circuitry for comparing received comparand data with the stored content addressable memory data, the memory array providing a hit signal and one or more parity bits for each row;
a parity generator having an input for receiving the comparand data and having an output for providing one or more generated parity bits; and
erroneous hit detection circuitry coupled to the memory array and the parity generator, the erroneous hit detection circuitry asserting a row error indicator for each row in which parity of the comparand data does not match parity of a row and there is an assertion of a hit signal for that row, the erroneous hit detection circuitry not asserting the row error indicator for each row in which parity of the comparand data matches parity of a row and there is no assertion of the hit signal for that row, the erroneous hit detection circuitry using the row error indicator for each row to provide an output which indicates whether at least one asserted hit signal corresponds to an erroneous hit.

19. The content addressable memory of claim 18 wherein the erroneous hit detection circuitry further comprises:
a first plurality of logic gates for receiving the one or more generated parity bits and parity bits stored in the content addressable memory, the first plurality of logic gates indicating whether correlated one or more generated parity bits and parity bits stored in the content addressable memory do not match; and
a second plurality of logic gates coupled to the first plurality of logic gates, the second plurality of logic gates further qualifying results of the first plurality of logic gates by limiting error indication to one or more rows of the content addressable memory having a hit.

20. The content addressable memory of claim 19 further comprising:
a reducing logic gate coupled to the second plurality of logic gates for receiving a plurality of row error indicators, each being correlated to a predetermined row of the content addressable memory, and providing a single error signal in response to any row of the content addressable memory having a hit and containing an error.

* * * * *